(12) United States Patent
Park

(10) Patent No.: US 11,069,398 B2
(45) Date of Patent: Jul. 20, 2021

(54) CONTROLLER AND OPERATING METHOD THEREOF

(71) Applicant: SK hynix Inc., Gyeonggi-do (KR)

(72) Inventor: Youn-Won Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/727,372

(22) Filed: Dec. 26, 2019

(65) Prior Publication Data

US 2020/0381036 A1 Dec. 3, 2020

(30) Foreign Application Priority Data

May 31, 2019 (KR) .................. 10-2019-0064437

(51) Int. Cl.
| | |
|---|---|
| *G11C 11/4076* | (2006.01) |
| *G11C 11/4074* | (2006.01) |
| *G06F 9/4401* | (2018.01) |
| *G06F 12/02* | (2006.01) |
| *G11C 11/409* | (2006.01) |

(52) U.S. Cl.
CPC ........ *G11C 11/4076* (2013.01); *G06F 9/4418* (2013.01); *G06F 12/0246* (2013.01); *G11C 11/409* (2013.01); *G11C 11/4074* (2013.01)

(58) Field of Classification Search
CPC ................................................. G11C 11/4076

USPC ........................................................ 365/233.1
See application file for complete search history.

(56) References Cited

U.S. PATENT DOCUMENTS

| | | | | |
|---|---|---|---|---|
| 2012/0074849 | A1* | 3/2012 | Kang ..................... | H05K 3/325 315/136 |
| 2020/0242025 | A1* | 7/2020 | Du ....................... | G06F 12/0882 |

FOREIGN PATENT DOCUMENTS

| | | |
|---|---|---|
| KR | 10-2016-0124990 | 10/2016 |
| KR | 10-2017-0042985 | 4/2017 |

* cited by examiner

*Primary Examiner* — Muna A Techane
(74) *Attorney, Agent, or Firm* — IP & T Group LLP

(57) ABSTRACT

A controller controlling a memory device includes an elapsed time calculator suitable for receiving an absolute time from a host whenever a state is changed between an active state and an inactive state, calculating an average hibernation elapsed time for elapsed times between first and second absolute times, and calculating a system time based on a third absolute time and the average hibernation elapsed time, and a flash translation layer suitable for controlling a program operation for the memory device in response to a program command for a memory region, calculating a program operation time for the memory region based on the system time, and controlling a read operation for the memory device using a read voltage, which is determined based on an elapsed time since the program operation time, in response to a read command for the memory region.

19 Claims, 6 Drawing Sheets

CONTROLLER AND OPERATING METHOD THEREOF

CROSS-REFERENCE TO RELATED APPLICATION

This application claims priority under 35 U.S.C. § 119 to Korean Patent Application No. 10-2019-0064437 filed on May 31, 2019, which is incorporated herein by reference in its entirety.

BACKGROUND

1. Field

Exemplary embodiments relate to a memory system.

2. Discussion of the Related Art

The computer environment paradigm has been transitioning to ubiquitous computing, which enables computing systems to be used virtually anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since memory systems have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a memory system having improved reliability by operating based on an estimated current time and an operating method thereof.

In an embodiment, there is provided a controller for controlling a memory device. The controller may include an elapsed time calculator suitable for receiving an absolute time from a host whenever a state is changed between an active state and an inactive state, calculating an average hibernation elapsed time for elapsed times between first and second absolute times, and calculating a system time based on a third absolute time and the average hibernation elapsed time; and a flash translation layer suitable for controlling a program operation for the memory device in response to a program command for a memory region, calculating a program operation time for the memory region based on the system time, and controlling a read operation for the memory device using a read voltage, which is determined based on an elapsed time since the program operation time, in response to a read command for the memory region.

In an embodiment, there is provided an operating method for a controller which controls a memory device. The operating method may include receiving an absolute time from a host whenever a state is changed between an active state and an inactive state; calculating an average hibernation elapsed time for elapsed times between first and second absolute times; calculating a system time based on a third absolute time and the average hibernation elapsed time; controlling a program operation for the memory device in response to a program command for a memory region; calculating a program operation time for the memory region based on the system time; and controlling a read operation for the memory device using a read voltage, which is determined based on an elapsed time since the program operation time, in response to a read command for the memory region.

In an embodiment, there is provided a data processing system includes a host and a memory system. The memory system may include a controller that has a busy state, a hibernation state and a sleep state and includes a timer that is not operated in the hibernation state, wherein the controller is suitable for: receiving first time information including a first time from the host; receiving second time information including a second time from the host; determining intervals of the busy state, intervals of the hibernation state and a hibernation number, in a period between the first time and the second time, the hibernation number indicating counts of switching from the busy state to the hibernation state; determining an average hibernation interval based on the intervals of the hibernation state and the counts in the period; receiving third time information including a third time from the host; and determining a current time, based on the third time, intervals of the busy state after the third time, a hibernation number after the third time and the average hibernation interval.

DETAILED DESCRIPTION

Figure 1:
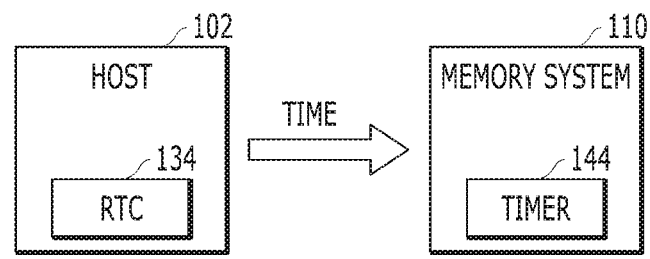
FIG. 1 is a diagram schematically illustrating a data processing system including a memory system according to an embodiment of this disclosure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, various embodiments of this disclosure are described in detail with reference to the accompanying drawings. It is to be noted that in the following description, only portions necessary to understand operations according to various embodiments are described and a description of other portions will be omitted in order to prevent the gist of the disclosure from becoming obscure.

Various embodiments are described in more detail below with reference to the accompanying drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use, purpose, and usage of a user. For example, the OS may be divided into a general OS and a mobile OS, depending on the mobility of the host 102. The general OS may be divided into a personal OS and an enterprise OS, depending on the environment of a user.

For example, the personal OS configured to support a function of providing a service to general users may include Windows and Chrome, and the enterprise OS configured to secure and support high performance may include Windows server, Linux, and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied as various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The host 102 may include a real-time clock (RTC) 104. The host 102 may be aware of a current time using the RTC 104 and provide time information on the current time to the memory system 110. The memory system 110 may receive the time information from the host 102. In some embodiments, the time information may include an absolute time.

The memory system 110 may include a timer 144. The memory system 110 may calculate a system time based on the absolute time and an elapsed time measured by the timer 144.

The memory system 110 may have any of a plurality of power states. For example, the plurality of power states may include an active state, a sleep state, and a power-off state.

In the active state, the memory system 110 may receive all types of requests from the host 102. The active state may be divided into a busy state and a hibernation state.

In the busy state, the memory system 110 may operate in response to a request from the host 102 or may perform a background operation. In the busy state, the memory system 110 may use all types of supported commands. The memory system 110 may switch the busy state to the hibernation state when the memory system 110 does not operate for a given elapsed time (for example, for 1 ms or more) in the busy state. In the hibernation state, the memory system 110 does not perform an operation corresponding to a request from the host 102 and a background operation. In the hibernation state, the memory system 110 may stop the operation of the timer 144 to reduce power consumption. The memory system 110 may receive all types of requests from the host 102 even in the hibernation state. The memory system 110 may switch the hibernation state to the busy state when the memory system 110 needs to resume an operation.

The memory system 110 may switch the active state to the sleep state in response to a request from the host 102. For example, if the state of the memory system 110 is a power-on state, but a user does not use the host 102, the host 102 may provide a sleep request to the memory system 110. In the sleep state, the power supply to the memory system 110 may be stopped. In the sleep state, the memory system 110 may operate only in response to some types of requests from the host 102. For example, in the sleep state, the memory system 110 may change a power state in response to a request for changing the power state. For another example, in the sleep state, the memory system 110 may provide the host 102 with sense data indicative of the current state of the memory system 110 in response to a sense data request. Power consumption of the memory system 110 in the sleep state is much lower than power consumption of the memory system 110 in the hibernation state. The memory system 110 may switch the sleep state to the active state in response to a sleep release request from the host 102.

The memory system 110 may switch the active state or the sleep state to the power-off state in response to a request from the host 102. For example, when the host 102 itself performs power-off, the host 102 may provide a power-off request to the memory system 110. In the power-off state, the supply of the entire power to the memory system 110 is stopped, and all of the volatile data stored in an internal memory are lost. In the power-off state, the memory system 110 may operate in response to only some types of requests from the host 102. For example, in the power-off state, the memory system 110 may operate in response to only a request for changing the power state or a sense data request. The memory system 110 may switch the power-off state to the active state in response to a power-on request from the host 102.

The timer 144 does not operate in the sleep state and the power-off state, and may not operate even in the hibernation state. The memory system 110 can measure only the elapsed time of the busy state through the timer 144. Accordingly, the memory system 110 cannot calculate an accurate system time if it has switched to the hibernation state after it received time information from the host 102.

However, a processing burden of the host 102 and the memory system 110 may increase if the host 102 provides an absolute time whenever the memory system 110 switches from the hibernation state to the busy state so that the memory system 110 can calculate an accurate system time. The reason is that the memory system 110 may frequently switch from the hibernation state to the busy state during the operation of the memory system 110.

According to an embodiment, the memory system 110 may receive an absolute time from the host 102 when the power state is changed between the active state and the inactive state. When the memory system 110 switches from the busy state to the hibernation state, the memory system 110 may calculate a busy elapsed time using the timer 144, and may count the number of switching times that the memory system 110 switches from the busy state to the hibernation state. The memory system 110 may calculate an average hibernation elapsed time based on time information, the busy elapsed time, and a hibernation number. The time information may include time information at two time points or more. The hibernation number represents the counted number switched to the hibernation state. The memory system 110 may calculate a system time more exactly based on an absolute time received from the host 102, a busy elapsed time since the absolute time, the hibernation number, and the average hibernation elapsed time.

According to an embodiment, when performing a read operation on a memory region, the memory system 110 may determine a read voltage based on the time difference between the time when the memory region is programmed and the time when the read operation is performed. Accordingly, the memory system 110 may improve the reliability of read data.

Figure 2:
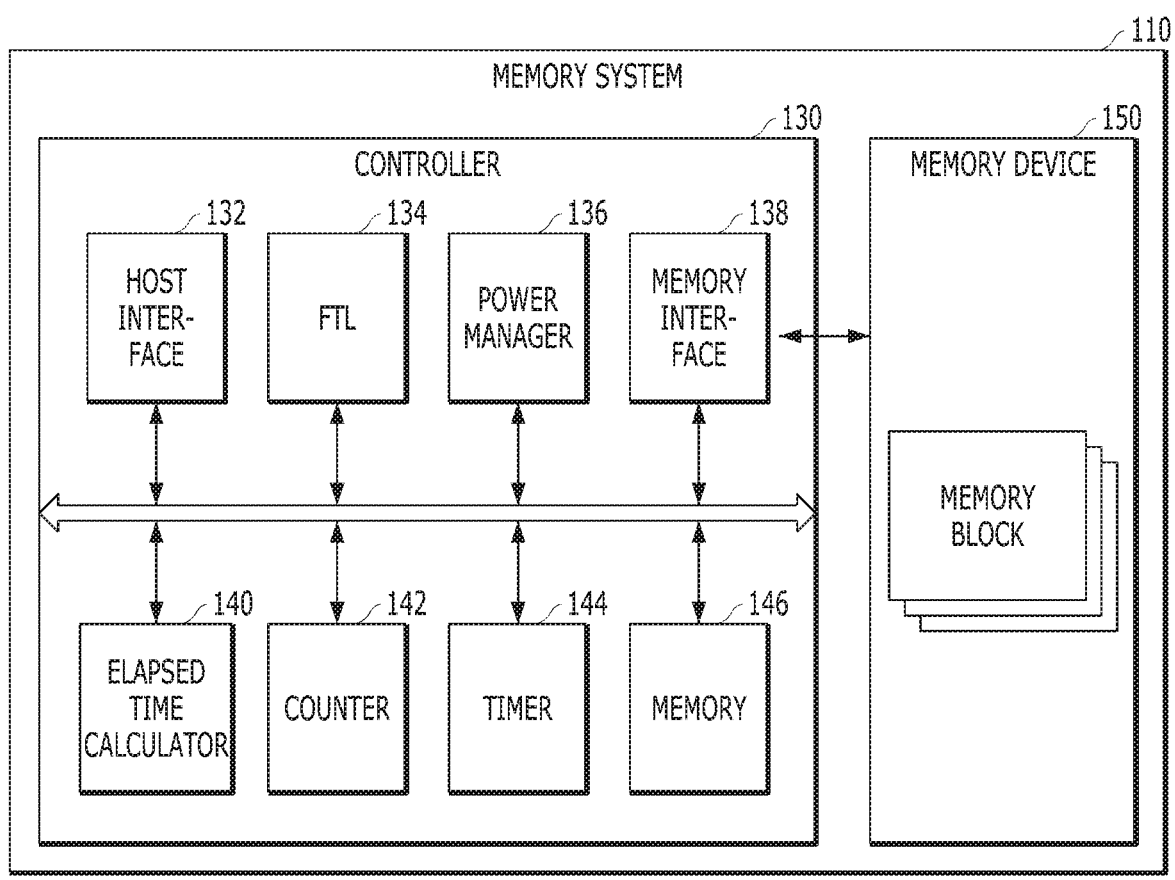
FIG. 2 is a diagram illustrating the structure of a memory system according to an embodiment of this disclosure.

FIG. 2 is a diagram illustrating the structure of the memory system 110 according to an embodiment of this disclosure.

Referring to FIG. 2, the memory system 110 may include a controller 130 and a memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . each of which may include a plurality of pages, and each of the pages may include a plurality of memory cells coupled to a word line.

In an embodiment, the memory device 150 may be a flash memory. The flash memory may have a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program, and erase operations of the memory device 150.

The controller 130 may include a host interface 132, a flash translation layer (FTL) 134, a power manager 136, a memory interface 138, an elapsed time calculator 140, a counter 142, the timer 144 and a memory 146, which are operatively connected through an internal bus.

The host interface 132 may be configured to process a command and data of the host 102. Further, the host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI) and integrated drive electronics (IDE).

The host interface 132 may be driven through firmware referred to as a host interface layer (HIL) in order to exchange data with the host.

The host interface 132 may receive time information from the host 102. In one embodiment, the host interface 132 may receive time information when the power state of the memory system 110 is changed between the active state and the sleep state or between the active state and the power-off state.

The FTL 134 may control an overall operation of the memory system 110. The H L 134 may be loaded onto the memory 146 and may operate in a processor (not illustrated) within the controller 130.

The FTL 134 may perform a foreground operation corresponding to a request from the host 102. The FTL 134 may map a logical address, corresponding to a request received from the host interface 132, to a physical address of the memory device 150. The FTL 134 may convert a write request, read request and an erase request into a program command, read command, and erase command for the memory device 150, respectively. In some implementations, the FTL 134 may maximize a one-shot program, one-shot read performance or parallel processing performance of the memory interface 142 by aligning the sequence of write commands and providing the write commands to the memory interface 142.

The FTL 134 may perform a background operation. For example, the FTL 134 may collect valid data, move the valid data to an empty block, and erase blocks including the moved valid data by performing a garbage collection so that the memory device 150 can have sufficient empty blocks.

The power manager 136 may control a power supply to the memory system 110 based on a power state of the memory system 110.

The memory interface 138 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory interface 138 may generate a control signal for the memory device 150 and process data to be provided to the memory device 150 under the control of the processor 134. The memory interface 138 may work as an interface (e.g., a NAND flash interface) for processing a command and data between the controller 130 and the memory device 150. Specifically, the memory interface 138 may support data transfer between the controller 130 and the memory device 150.

The memory interface 138 may be driven through firmware referred to as a flash interface layer (FIL) in order to exchange data with the memory device 150.

In an implementation, the memory interface 138 may include an error correction code (KC) circuit capable of detecting and correcting an error contained in the data read from the memory device 150. In other words, the ECC circuit may perform an error correction decoding process to the data read from the memory device 150 through an ECC value used during an ECC encoding process. According to a result of the error correction decoding process, the ECC circuit may output a signal, for example, an error correction success/fail signal. When the number of error bits is more than a threshold value of correctable error bits, the ECC circuit may not correct the error bits, and may output an error correction fail signal.

The memory 146 may serve as a working memory of the memory system 110 and the controller 130, and store data for driving the memory system 110 and the controller 130. The controller 130 may control the memory device 150 to perform read, program, and erase operations in response to a request from the host 102. The controller 130 may provide data read from the memory device 150 to the host 102, may store data provided from the host 102 into the memory device 150. The memory 146 may store data required for the controller 130 and the memory device 150 to perform these operations.

The memory 146 may store an absolute time received from the host 102, a hibernation number counted by the counter 142, and a busy elapsed time calculated by the timer 144.

The memory 146 may be embodied by a volatile memory. For example, the memory 146 may be embodied by static random access memory (SRAM) or dynamic random access memory (DRAM). The memory 146 may be disposed within or out of the controller 130. FIG. 1 exemplifies the memory 146 disposed within the controller 130. In an embodiment, the memory 146 may be embodied by an external volatile memory having a memory interface transferring data between the memory 146 and the controller 130.

The timer 144 may operate in the busy state of the memory system 110 and measure a busy elapsed time.

The counter 142 may count the hibernation number of the memory system 110.

The elapsed time calculator 140 may calculate the system time of the memory system 110 based on an average hibernation elapsed time between two or more absolute times received from the host 102, the busy elapsed time of the memory system 110 from an absolute time received from the host 102, and a hibernation number.

Figure 3:
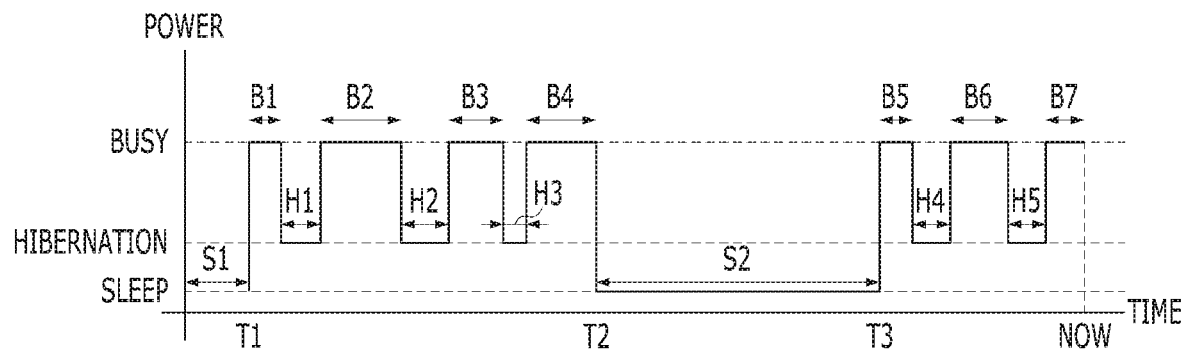
FIG. 3 is a diagram illustrating a method of estimating a current time of a memory system by an elapsed time calculator.

FIG. 3 is a diagram illustrating a method of calculating, by the elapsed time calculator 140, the system time of the memory system 110.

In the graph of FIG. 3, a horizontal axis indicates an elapsed time (TIME), and a vertical axis indicates power (POWER). A solid line indicates a power supply to the memory system 110 according to the elapsed time.

Power in the busy state, the hibernation state and the sleep state (that is, an example of the inactive state) is illustrated in the vertical axis of the graph.

First to third times T1 to T3 and a current time NOW are illustrated in the horizontal axis of the graph. The first to third times T1 to T3 indicate absolute times received by the host interface 132 from the host 102. First to seventh busy elapsed times B1 to B7, first to fifth hibernation elapsed times H1 to H5, and first and second sleep elapsed times S1 and S2 are illustrated in the graph.

Associated with FIG. 3, the host interface 132 of FIG. 2 may receive an absolute time from the host 102 when the memory system 110 switches from the active state to the inactive state or switches from the inactive state to the active state.

In some implementations, the host interface 132 may receive, from the host 102, time information along with a sleep request, a sleep release request, a power-off request, or a power-on request. In some implementations, the host interface 132 may provide a response along with a time information request signal in response to a sleep request, sleep release request, power-off request, or power-on request from the host 102. The host interface 132 may receive, from the host 102, time information in response to the time information request signal.

In the example of FIG. 3, at the first time T1, the memory system 110 may switch from the sleep state to the active state. The host interface 132 may obtain time information of the first time T1 from the host 102. The memory 146 may store the time information.

At the first to fourth busy elapsed times B1 to B4, the timer 144 may operate and measure busy elapsed times. At the first to third hibernation elapsed times H1 to H3, the timer 144 may not operate. The counter 142 may count a hibernation number when the memory system 110 switches from the busy state to the hibernation state.

The memory 146 may store information on the busy elapsed times and the hibernation number.

At the second time T2, the memory system 110 may switch from the active state to the sleep state. The host interface 132 may obtain time information of the second time from the host 102. In some implementations, the FTL 134 may control the memory device 150 to program information on the busy elapsed time B1 to B4 and the hibernation number, stored in the memory 146 through the memory interface 138, and the first and second times T1 and T2 received from the host 102.

At the third time T3, the memory system 110 may switch from the sleep state to the active state. The host interface 132 may obtain the third time T3, that is, an absolute time, from the host 102. The memory 146 may store the absolute time.

In some implementations, the FTL 134 may load the first and second times T1 and T2, the busy elapsed times B1 to B4, and the hibernation number, which are programmed into the memory device 150, onto the memory 146 through the memory interface 138.

The elapsed time calculator 140 may calculate an average hibernation elapsed time based on the first and second times T1 and T2, the busy elapsed times B1 to B4, and the hibernation number.

In the example of FIG. 3, the elapsed time calculator 140 may calculate the sum of the first to third hibernation elapsed times H1 to H3 by subtracting the first to fourth busy elapsed times B1 to B4 from an elapsed time between the first and second times T1 and T2. That is, although each of the first to third hibernation elapsed times H1 to H3 cannot be measured because the timer 144 does not operate in the hibernation state, the elapsed time calculator 140 can calculate a total hibernation elapsed time between the first and second times T1 and T2. In the example of FIG. 3, a total hibernation number having occurred between the first and second times T1 and T2 is 3. The elapsed time calculator 140 may calculate an average hibernation elapsed time by dividing a hibernation elapsed time between the first and second times T1 and T2 by the total hibernation number.

The elapsed time calculator 140 may calculate a system time based on information of an absolute time received from the host 102, a busy elapsed time since the absolute time, a hibernation number, and average hibernation elapsed times between the first and second times T1 and T2.

A method of calculating, by the elapsed time calculator 140, the current (NOW) system time is described with reference to FIG. 3. The timer 144 may operate in the fifth to seventh busy elapsed times B5 to B7 from the third time T3 to the current time (NOW), and may measure a busy elapsed time. The timer 144 may not operate in the fourth and fifth hibernation elapsed times H4 and H5. The counter 142 may count a hibernation number from the third time T3 to the current time (NOW). In the example of FIG. 3, a hibernation number since the third time T3 is 2.

The current (NOW) system time may be calculated as the sum of the third time T3, the fifth to seventh busy elapsed times B5 to B7, and the fourth and fifth hibernation elapsed times H4 and H5. Since the timer 144 does not operate at the hibernation state, the elapsed time calculator 140 may not exactly calculate the accurate fourth and fifth hibernation elapsed times H4 and H5. However, the fourth and fifth hibernation elapsed times H4 and H5 may be considered to be identical to the average hibernation elapsed times between the first and second times T1 and T2, respectively. Then, the elapsed time calculator 140 may calculate the current (NOW) system time.

That is, the system time may be calculated by adding an absolute time to the sum of a total busy elapsed time and total hibernation elapsed time since the absolute time. In this case, the total hibernation elapsed time may be calculated as the multiplication of a hibernation number since the absolute time and the average hibernation elapsed times between the first and second times T1 and T2.

According to an embodiment, the memory system 110 may calculate a system time based on an average hibernation elapsed time and a hibernation number although the timer 144 does not operate in the hibernation state and the memory system does not receive an absolute time from the host 102 when the state of the memory system 110 is changed between the active state and the hibernation state. The memory system 110 may improve the reliability of data read from the memory device 150 by controlling the read voltage of the memory device 150 based on the system time. An embodiment in which the memory device 150 controls the read voltage of the memory device 150 based on the system time is described below.

Referring back to FIG. 2, the memory device 150 may program data into memory cells in such a way to inject charges into the floating gates of the memory cells by applying a program voltage to a corresponding word line. The threshold voltage of each of multiple memory cells into which the same data has been programmed may have a threshold voltage distribution of a constant range due to a difference in fine electrical characteristics between the memory cells. For example, if a multi-level cell is programmed, the multi-level cell may have any one of three program states P1 to P3 and one erase state E as shown in FIGS. 4 and 5.

Figure 4:
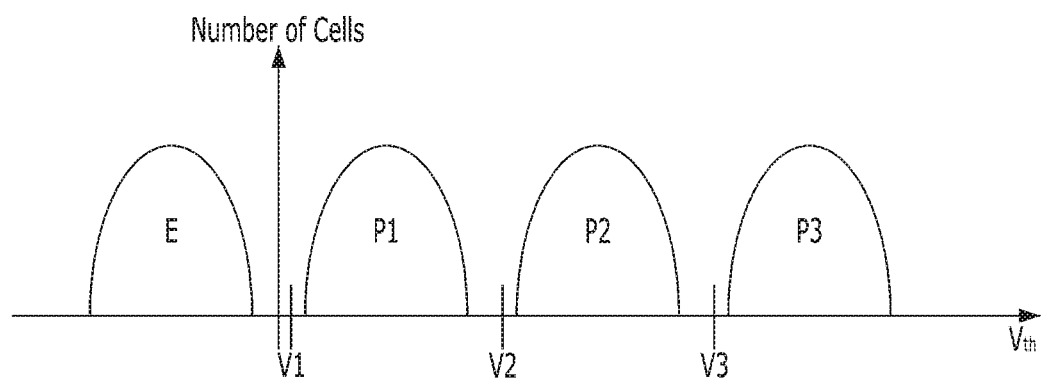
FIGS. 4 and 5 are diagrams illustrating threshold voltage distributions of memory cells in a memory device.
Figure 5:
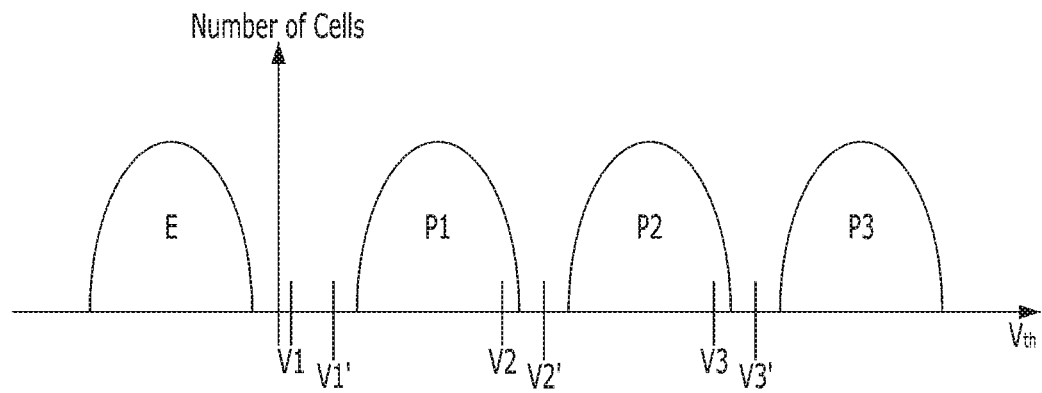

FIGS. 4 and 5 are diagrams illustrating threshold voltage distributions of memory cells in the memory device 150.

FIG. 4 illustrates ideal threshold voltage distributions which may appear in multi-level cells. The threshold voltage distributions in FIG. 4 may have read voltage margins of a given range without overlapping each other. When reading memory cells having the threshold voltage distributions of FIG. 4, the memory device 150 may distinguish between the threshold voltage states of the memory cells by applying first to third voltages V1 to V3 to a word line to which the memory cells have been connected.

After the memory cells are programmed, some charges injected into the floating gates of the memory cells may leak within a short elapsed time, for example, 1 minute, depending on the characteristics of a non-volatile memory cell element. The memory device 150 may program the memory cells so that they have threshold voltages greater than an ideal threshold voltage in order to supplement some charges leaking within the short elapsed time. When the threshold voltages of the memory cells are lowered because some charges of the floating gates leak after the memory cells are programmed, the memory device 150 may distinguish between the threshold voltage states of the memory cells by applying the first to third voltages V1 to V3 to the word line.

FIG. 5 illustrates threshold voltage distributions which may appear in multi-level cells right after a program operation is performed. Data may be erroneously read if the memory device 150 applies first to third voltages V1 to V3 to a corresponding word line before some charges of the floating gates of memory cells leak after the memory cells are programmed. In the example of FIG. 5, memory cells programmed and intended for the first program state P1 may include memory cells having threshold voltages greater than the second voltage V2 right after the memory cells are programmed. If the corresponding memory cells are read right after being programmed, the corresponding memory cells may be read with the second program state P2. Intended data may be correctly read if the memory device 150 applies first prime to third prime voltages V1' to V3' to the corresponding word line right after the memory cells are programmed.

According to an embodiment, the memory interface 138 may control the memory device 150 to perform a read operation on a memory cell at a read voltage expected based on a given elapsed time if data is read from the memory cell again within the elapsed time after the memory cell is programmed based on a system time from the elapsed time calculator 140.

Figure 6:
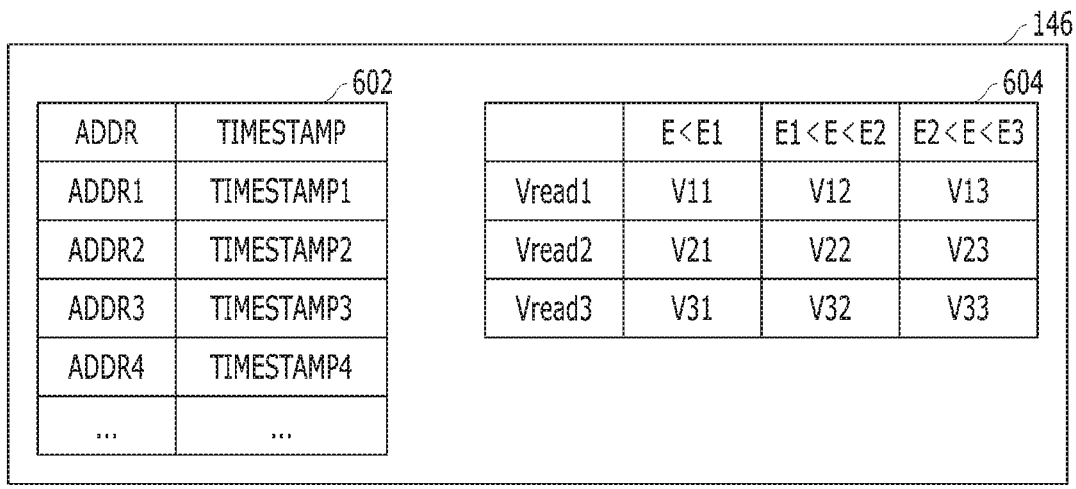
FIGS. 6, 7A and 7B are diagrams illustrating operations of a memory system according to an embodiment of this disclosure.
Figure 7A:
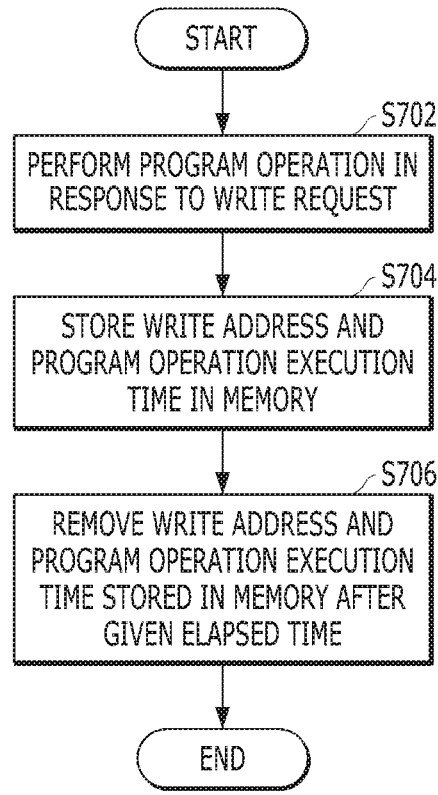
Figure 7B:
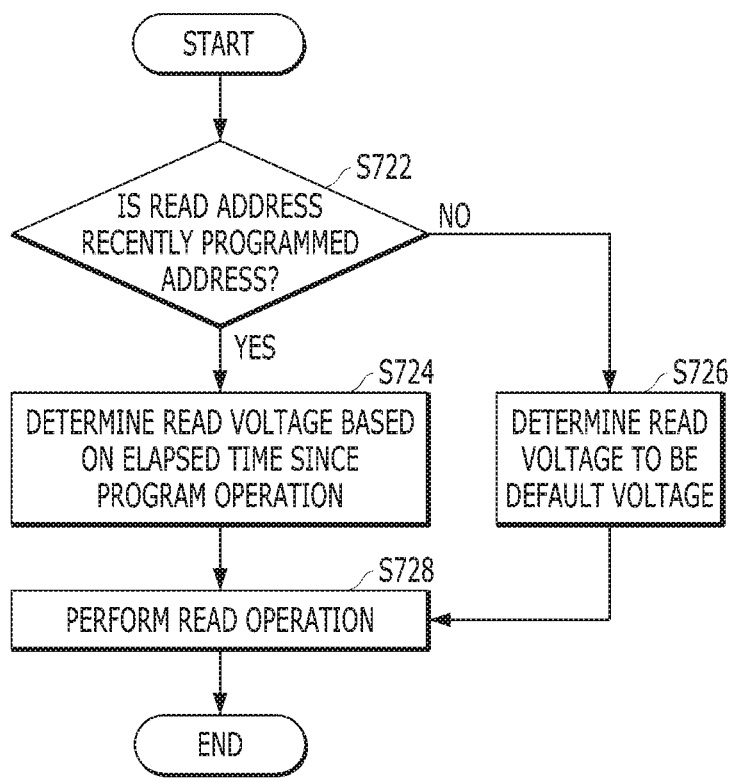

FIGS. 6, 7A and 7B are diagrams illustrating operations of the memory system 110 according to an embodiment of this disclosure.

FIG. 6 illustrates a program time table 602 and a read voltage table 604 which may be stored in the memory 146.

Referring to FIG. 6, the program time table 602 may include fields for addresses ADDR and time stamps TIMESTAMP. The address ADDR indicates an address associated with a recently performed program operation. The time stamp TIMESTAMP indicates time when a program operation corresponding to an address is performed.

The read voltage table 604 may store a read voltage for each range of an elapsed time after a program operation is performed. The read voltage table 604 may include indices for read voltages Vread1 to Vread3 for identifying threshold voltages, and fields for the ranges of an elapsed time E since a program operation was performed. For example, "E1<E<E2" indicates a case where an elapsed time E is greater than "E1" and less than "E2." In some implementations, a read voltage for each range of an elapsed time may be experimentally determined and previously stored in the memory 146. For example, the read voltages Vread1 to Vread3 may become higher as elapsed times are shorter, but this disclosure is not limited thereto. FIG. 6 illustrates the three read voltages Vread1 to Vread3, but the number of read voltages may be varied depending on the number of bits which may be stored in memory cells.

FIG. 7A is a flowchart illustrating a program operation of the memory system 110 according to an embodiment of this disclosure.

Referring to FIG. 7, at step S702, the FTL 134 may control the memory device 150 to perform a program operation in response to a write request through the memory interface 138. The write request may include a write address and write data. The write request may be received from the host 102. Alternatively, the write request may be generated during a background operation. As described with reference to FIG. 5, the memory device 150 may perform a program operation so that memory cells have a voltage distribution slightly greater than an ideal threshold voltage distribution.

At step S704, the FTL 134 may store the write address and the time when the program operation was performed, in the memory 146. For example, when the program operation is completed, the FTL 134 may obtain a system time from the elapsed time calculator 140 and store the system time in the memory 146 as a program operation time.

At step S706, the FTL 134 may remove the write address and the program operation time from the memory 146 after a given elapsed time since the program operation was performed.

FIG. 7B is a flowchart illustrating a read operation of the memory system 110 according to an embodiment of this disclosure.

Referring to FIG. 7B, at step S722, the FTL 134 may determine whether a memory region on which a read operation is to be performed is a recently programmed memory region in response to a read request. For example, the read request may include a read address. The FTL 134 may determine whether the read address is the address of the recently programmed memory region with reference to the program time table 602 in the memory 146. In some implementations, the memory interface 138 may determine whether the read address is stored in the program time table 602.

If the read address is the address of the recently programmed memory region ("YES" at step S722), at step S724, the FTL 134 may determine a read voltage based on an elapsed time since a program operation. For example, the FTL 134 may calculate a program operation time based on a time stamp corresponding to the address of the program time table 602, and may calculate an elapsed time since a program operation based on a current system time obtained from the elapsed time calculator 140. The FTL 134 may obtain a read voltage according to the elapsed time since the program operation with reference to the read voltage table 604. The FTL 134 may store the obtained read voltage in a register of the memory device 150 through the memory interface 138.

If the read address is not the address of the recently programmed memory region ("NO" at step S722), at step S726, the memory interface 138 may determine a read voltage to be a default voltage.

At step S728, the FTL 134 may control the memory device 150 to perform a read operation through the memory interface 138 by applying the determined read voltage to a corresponding word line.

The memory system 110 may improve the reliability of read data by determining a read voltage when reading recently programmed data again based on a system time from the elapsed time calculator 140.

Figure 8:
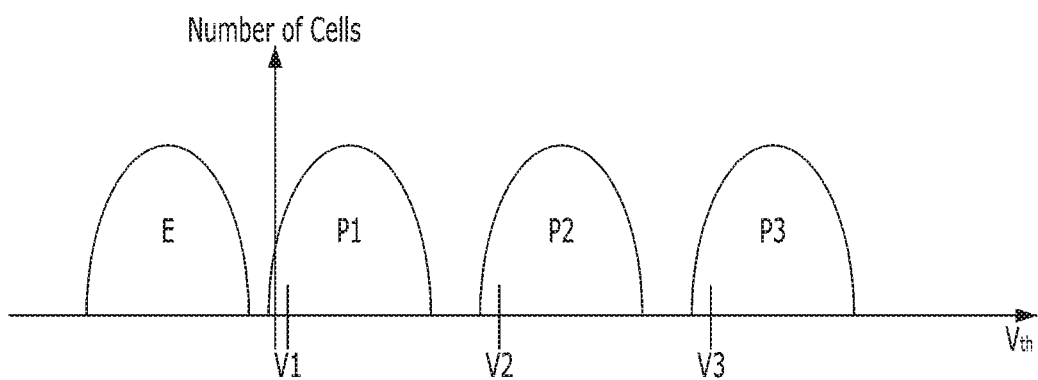
FIG. 8 illustrates threshold voltage distributions of multi-level cells after a program is performed.

FIG. 8 illustrates threshold voltage distributions which may appear in multi-level cells after a program operation is performed and an elapsed time elapses.

If an elapsed time is long after an ideal threshold voltage distribution of programmed memory cells is formed, the threshold voltage distribution may be lowered because charges injected into the floating gates of the memory cells leak. In this case, data may be erroneously read if the memory device 150 applies first to third voltages V1 to V3 to a corresponding word line connected to memory cells having a long elapsed time since the memory cells was programmed.

According to an embodiment, the memory interface 138 may control the memory device 150 to perform a read operation using a read voltage, which is determined based on a system time from the elapsed time calculator 140, when performing the read operation.

Figure 9:
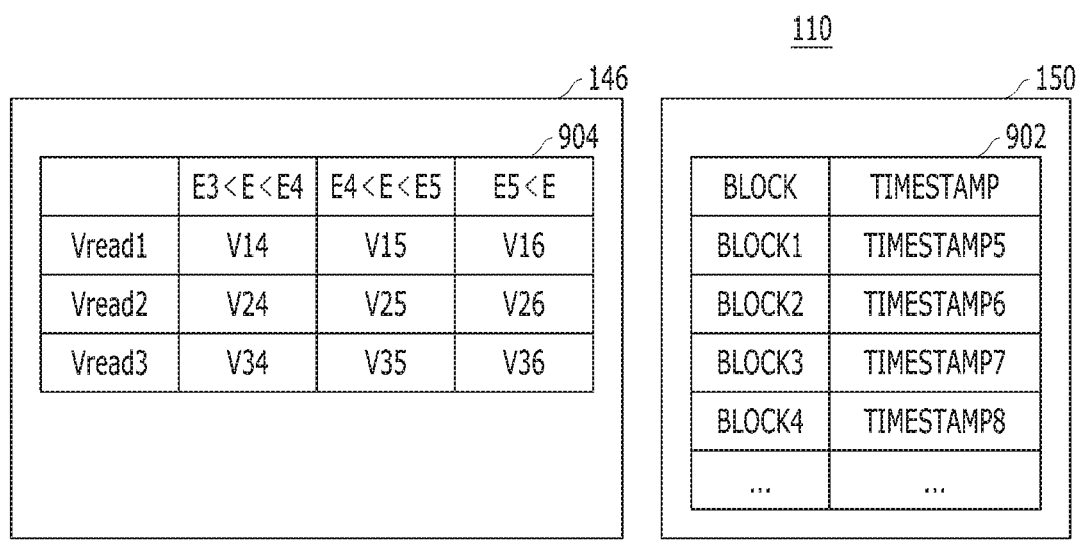
FIGS. 9, 10A and 10B are diagrams illustrating operations of a memory system according to an embodiment of this disclosure.
Figure 10A:
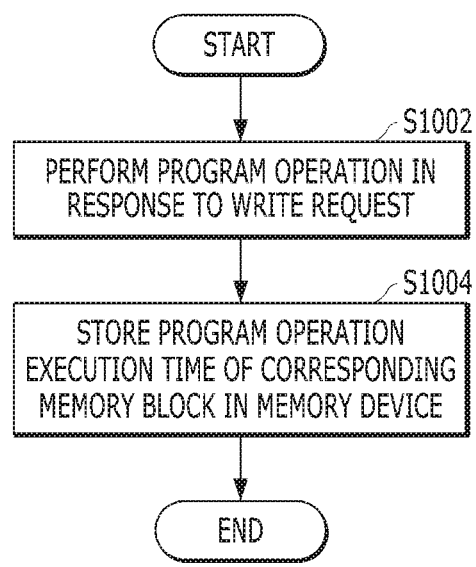
Figure 10B:
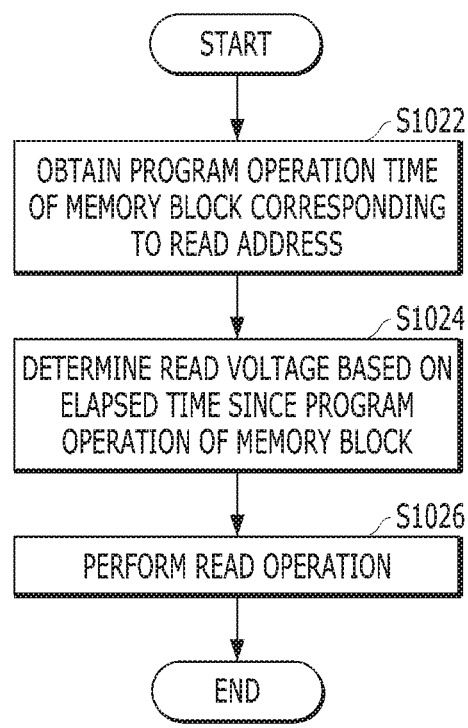

FIGS. 9, 10A and 10B are diagrams illustrating operations of the memory system 110 according to an embodiment of this disclosure.

FIG. 9 is a diagram illustrating data which may be stored in the memory system 110. By way of example, FIG. 9 illustrates a read voltage table 904 which may be stored in the memory 146 and a program time table 902 which may be stored in the memory device 150.

Referring to FIG. 9, the program time table 902 may include fields for a block BLOCK and a time stamp TIMESTAMP. The block BLOCK indicates each of the blocks in the memory device 150. The time stamp TIMESTAMP indicates a time when a program operation is performed on a block.

The read voltage table 904 may store a read voltage for each range of an elapsed time since a program operation was performed. The read voltage table 904 may include indices for read voltages Vread1 to Vread3 for identifying threshold voltages, and may include fields for the ranges of an elapsed time E since a program operation was performed. For example, the read voltages Vread1 to Vread3 may be lowered as the elapsed time is longer, but this disclosure is not limited thereto. Although FIG. 9 illustrates the three read voltages Vread1 to Vread3, the number of read voltages may be different depending on the number of bits which may be stored in memory cells.

FIG. 10A is a flowchart illustrating a program operation of the memory system 110 according to an embodiment of this disclosure.

Referring to FIG. 10A, at step S1002, the FTL 134 may control the memory device 150 to perform a program operation in response to a write request through the memory interface 138. The write request may include a write address and write data.

At step S1004, the FTL 134 may store a program operation execution time into the memory device 150 as the program operation execution time of a memory block corresponding to the write address through the memory interface 138. For example, the FTL 134 may obtain a system time from the elapsed time calculator 140 when the program operation is completed, and may control the memory device 150 to store the system time in the program time table 902 as the program operation execution time of the memory block. In some implementations, the program time table 902 may be programmed into a system block of the memory device 150. In some implementations, the FTL 134 may not perform the operation of step S1004 whenever all the pages of a memory block are programmed. For example, the FTL 134 may perform the operation of step S1004 only when the last page of a memory block is programmed.

FIG. 10B is a flowchart illustrating a read operation of the memory system 110 according to an embodiment of this disclosure.

Referring to FIG. 10B, at step S1022, the FTL 134 may obtain the program operation time of a memory block on which a read operation is to be performed in response to a read request. For example, the read request may include a read address. The FTL 134 may obtain the program operation time of the memory block corresponding to the read address with reference to the program time table 902.

At step S1024, the FTL 134 may determine a read voltage based on an elapsed time since the program operation of the memory block. For example, the FTL 134 may calculate the elapsed time since the program operation based on program operation time information of the memory block, obtained with reference to the program time table 902, and a current system time obtained from the elapsed time calculator 140. The FTL 134 may obtain a read voltage according to the elapsed time since the program operation with reference to the read voltage table 904.

At step S1026, the FTL 134 may control the memory device 150 to perform a read operation through the memory interface 138 by applying the determined read voltage to a corresponding word line.

The memory system 110 may improve the reliability of read data by determining a read voltage when data having a long elapsed time since a program operation was performed is read again based on a system time from the elapsed time calculator 140.

As described with reference to FIGS. 1 to 10B, the memory system 110 may receive an absolute time from the host 102 when the state of the memory system 110 is changed between an active state and an inactive state. The memory system 110 may calculate an average hibernation elapsed time between first and second times received from the host 102. The memory system 110 may calculate a system time based on a third time received from the host 102, the number of times that the memory system 110 switches to a hibernation state after the third time, which is counted by the counter 142, an active time interval detected by the timer 144, and an average hibernation elapsed time.

The memory system 110 may switch to a hibernation state if it does not temporarily operate in a busy state, and may switch to a busy state although it receives any command in the hibernation state. A change in the state of the memory system 110 between the busy state and the hibernation state may frequently occur. The memory system 110 does not increase power consumption of the memory system 110 because it does not drive the timer 144 in a hibernation state in order to calculate a system time. Furthermore, the memory system 110 rarely increases a processing burden between the memory system 110 and the host 102 because it can calculate a system time even without receiving an absolute time from the host 102 when the memory system 110 switches between a busy state and a hibernation state.

The memory system 110 may improve the reliability of data read from the memory device 150 by determining a read voltage based on a calculated system time while not increasing power consumption and a processing burden.

This disclosure describes a memory system having improved reliability by operating based on an estimated current time and the operating method thereof.

Although the detailed embodiments have been described in the detailed description of the disclosure, the disclosure may be modified in various ways without departing from the scope of the disclosure. Accordingly, the scope of the disclosure should not be limited to the above-described embodiments, but should be defined by not only the claims, but equivalents thereof.

What is claimed is:

1. A controller controlling a memory device comprising:
   an elapsed time calculator suitable for receiving a first absolute time from a host whenever a state is changed from an inactive state to an active state, receiving a second absolute time from a host whenever the state is changed from the active state to the inactive state, calculating an average hibernation elapsed time for elapsed times between the first and second absolute times, and calculating a system time based on the average hibernation elapsed time and a third absolute time which is received from the host after the second absolute time; and
   a flash translation layer suitable for controlling a program operation for the memory device in response to a program command for a memory region, calculating a program operation time for the memory region based on the system time, and controlling a read operation for the memory device using a read voltage, which is determined based on an elapsed time since the program operation time, in response to a read command for the memory region.

2. The controller of claim 1, wherein the elapsed time calculator calculates a total hibernation elapsed time between the first and second absolute times based on the elapsed times and a busy elapsed time between the first and second absolute times, and calculates the average hibernation elapsed time based on the total hibernation elapsed time and a hibernation number between the first and second absolute times.

3. The controller of claim 1, wherein the elapsed time calculator calculates a total hibernation elapsed time since the third absolute time based on a hibernation number after the third absolute time and the average hibernation elapsed time, and calculates the system time based on a busy elapsed time since the third absolute time and the total hibernation elapsed time since the third absolute time.

4. The controller of claim 1, wherein the elapsed time calculator calculates the elapsed time since the program operation time based on the program operation time and the system time.

5. The controller of claim 1, wherein the flash translation layer determines the read voltage to be lower when the elapsed time since the program operation time is longer.

6. The controller of claim 1, wherein the inactive state comprises a sleep state and a power-off state.

7. The controller of claim 1, further comprising a memory suitable for storing the program operation time,
   wherein the flash translation layer removes the program operation time stored in the memory after a given elapsed time from the program operation time.

8. The controller of claim 7, wherein the flash translation layer determines the read voltage to be a voltage greater than a default read voltage when the program operation time is stored in the memory.

9. The controller of claim 7, wherein the memory further stores a read voltage table for storing a read voltage for each range of an elapsed time after the program operation time.

10. The controller of claim 2, further comprising:
    a timer suitable for measuring the busy elapsed times; and
    a counter suitable for counting the hibernation number.

11. An operating method of a controller controlling a memory device, the operating method comprising:

receiving a first absolute time from a host whenever a state is changed from an inactive state to an active state;

receiving a second absolute time from a host whenever the state is changed from the active state to the inactive state;

calculating an average hibernation elapsed time for elapsed times between first and second absolute times;

calculating a system time based on the average hibernation elapsed time and a third absolute time which is received from the host after the second absolute time;

controlling a program operation for the memory device in response to a program command for a memory region;

calculating a program operation time for the memory region based on the system time; and controlling a read operation for the memory device using a read voltage, which is determined based on an elapsed time since the program operation time, in response to a read command for the memory region.

12. The operating method of claim 11, wherein the calculating of the average hibernation elapsed time of the elapsed times between the first and second absolute times comprises:

calculating a total hibernation elapsed time between the first and second absolute times based on the elapsed times and a busy elapsed time between the first and second absolute times; and calculating the average hibernation elapsed time based on the total hibernation elapsed time and a hibernation number between the first and second absolute times.

13. The operating method of claim 11, wherein the calculating of the system time based on the third absolute time and the average hibernation elapsed time comprises:

calculating a total hibernation elapsed time since the third absolute time based on a hibernation number after the third absolute time and the average hibernation elapsed time; and calculating the system time based on a busy elapsed time since the third absolute time and the total hibernation elapsed time since the third absolute time.

14. The operating method of claim 11, further comprising calculating the elapsed time since the program operation time based on the program operation time and the system time.

15. The operating method of claim 11, further comprising determining the read voltage to be lower when the elapsed time since the program operation time is longer.

16. The operating method of claim 11, wherein the inactive state comprises a sleep state and a power-off state.

17. The operating method of claim 11, further comprising:

storing the program operation time in a memory of the controller; and removing the program operation time stored in the memory after a given elapsed time from the program operation time.

18. The operating method of claim 17, further comprising determining the read voltage to be a voltage greater than a default read voltage when the program operation time is stored in the memory.

19. A data processing system comprising:

a host; and a memory system including a controller that has a busy state, a hibernation state and a sleep state and includes a timer that is not operated in the hibernation state, wherein the controller is suitable for:

receiving first time information including a first time from the host;

receiving second time information including a second time from the host;

determining intervals of the busy state, intervals of the hibernation state and a first hibernation number, between the first time and the second time;

determining an average hibernation interval based on the intervals of the hibernation state and the counts in the period first hibernation number;

receiving third time information including a third time from the host; and determining a current time, based on the third time, intervals of the busy state after the third time, a second hibernation number after the third time and the average hibernation interval and wherein the first and second hibernation number indicate counts of switching from the busy state to the hibernation state.

* * * * *